United States Patent [19]

Burnett

[11] 4,421,233

[45] Dec. 20, 1983

[54] ANTI-STATIC TRAY FOR SEMI-CONDUCTOR DEVICES AND COMPONENTS

[75] Inventor: Thomas R. Burnett, Ontario, Canada

[73] Assignee: Northern Telecom Limited, Montreal, Canada

[21] Appl. No.: 408,210

[22] Filed: Aug. 16, 1982

[51] Int. Cl.³ .............. B65D 21/02; B65D 85/30; B65D 81/02; B65D 85/62

[52] U.S. Cl. .................. 206/503; 206/328; 206/334; 206/518; 206/593

[58] Field of Search ............... 206/328, 334, 523, 593, 206/503, 511, 518, 454

[56] References Cited

U.S. PATENT DOCUMENTS

| 1,066,359 | 7/1913 | Adams | 206/511 |
| 1,142,017 | 6/1915 | Brown | 206/593 |
| 2,005,967 | 6/1935 | Berdan | 206/454 |
| 3,804,239 | 4/1974 | O'Brien | 206/523 |
| 4,211,324 | 7/1980 | Ohlbach | 206/328 |

OTHER PUBLICATIONS

I.B.M. Bulletin, *Protective Container for Circuit Modules*; vol. 17, No. 10, 3, 1975.

*Primary Examiner*—William T. Dixson, Jr.
*Attorney, Agent, or Firm*—Sidney T. Jelly

[57] ABSTRACT

An anti-static tray for holding semi-conductor devices and components, is formed by a flat sheet of metal, for example aluminum, with a layer of electrically conducting foam material on one side. Terminal pins extending from the devices are pushed into the foam, and securely held. The devices are then protected from static charges which might be applied by persons removing devices as any static charge is bled off into the metal sheet. Legs can be formed by bending down short lengths of metal from the sheet, so that trays can be stacked without contact between a tray and devices and components mounted on the tray beneath.

1 Claim, 4 Drawing Figures

ANTI-STATIC TRAY FOR SEMI-CONDUCTOR DEVICES AND COMPONENTS

This invention relates to an anti-static tray for semi-conductor devices and components, the tray being suitable for storage and for carriage of devices and components having terminal pins.

Semi-conductor devices and components, such as packaged large scale integrated (LSI) circuits, hybrid devices, resonators, printed circuit boards such as small ceramic substrates having semi-conductor devices formed or mounted thereon, are extremely sensitive to static charges. Static charges very often build up on persons working on such devices, assembling devices and otherwise handling them. Such static charges can seriously damage semi-conductor devices.

The present invention provides an anti-static tray comprising a rigid planar metal support member on one surface of which is a layer of electrically conducting foam. Terminal pins extending from devices and components stick into the foam. The metal support member acts as a sink for any static charge.

Figure 1:
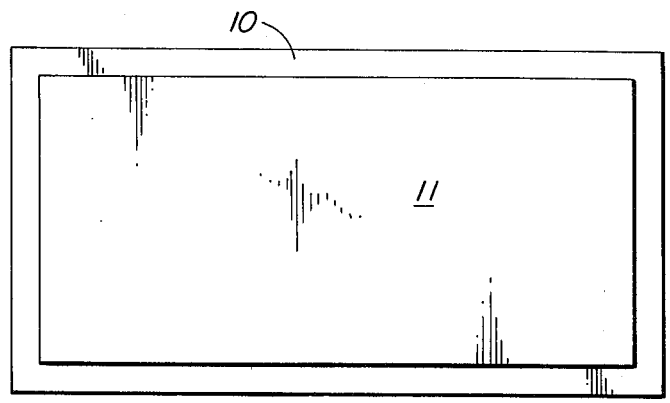
Figure 2:
Figure 3:
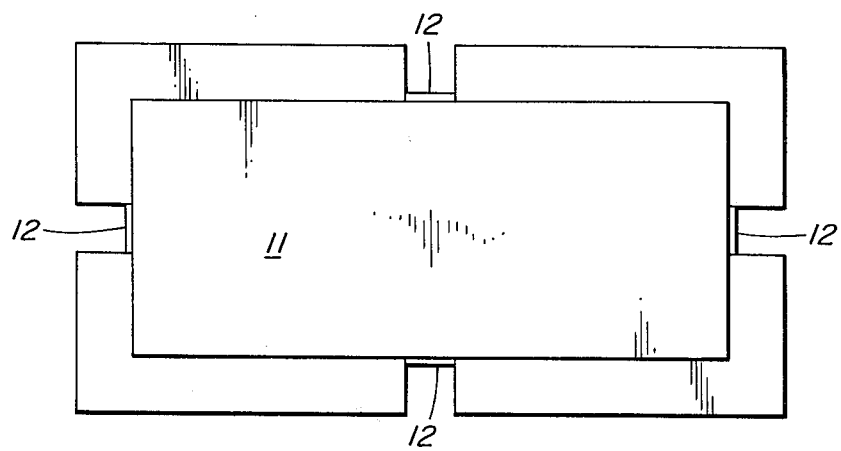
Figure 4:
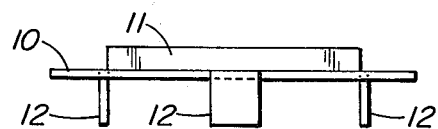

The invention will be readily understood by the following description of an embodiment, by way of example, in conjunction with the accompanying drawings, in which:

FIG. 1 is a plan view of a tray;
FIG. 2 is an end view of the tray of FIG. 1;
FIG. 3 is a plan view of a modified form of tray; and
FIG. 4 is an end view of the tray of FIG. 3.

As illustrated in FIG. 1 a tray comprises a flat sheet of metal 10, for example aluminium, with a layer of electrically conducting foam 11 bonded to one surface of the metal sheet. The foam 11 is resilient, of a nature which permits terminal pins to stick into the foam. The devices are held quite firmly by the foam gripping the pins.

The tray can be used as a holding member merely lying flat on a shelf, bench or other member. The metal sheet does not have to be in electrical contact with a further electrically conducting member, but acts as a sink which absorbs static. Semi-conductor items are positioned on the foam and then if removed, any static charge on the person removing an item will be discharged into the metal sheet via the conducting foam, instead of being discharged into the item.

Trays can be positioned, on edge, in transfer and storage totes, for movement along assembly lines, into and out of storage, and along processing lines. The grip of the foam is sufficient to hold the devices and components firmly, even with the trays on edge.

In a modification illustrated in FIGS. 3 and 4 short legs 12 are bent down from the plane of the sheet 10, to permit stacking without contact between the components and devices on a lower tray and the metal sheet of an upper tray. The length of the legs 12 can vary, depending upon the clearance required between trays.

As stated, a convenient metal for the metal sheet 10 is aluminium, and can, for example, be about 0.040" thick. A suitable foam material is one sold under the trademark Velostat by the Three M Company. A typical thickness is ¼", this being determined to some extent by the length of the terminal pins of a component or device; and the density of the material, Velostat being low density. The length and width of the sheet 10 can be varied to suit requirements. The foam layer is usually slightly smaller in length and width, mainly to permit easy sliding into support grooves in a tote, leaving a clear margin 13 around the periphery of the sheet 10. Such a margin will also normally be provided when legs 12 are formed.

What is claimed is:

1. A stackable anti-static try for leaded semi-conductor devices and components, comprising;
    a rigid rectangular planar metal support member;
    a layer of electrically conducting foam material bonded to an upper surface of said support member, for reception of leads of leaded devices and components;
    a peripherally extending clear margin extending along the edges of the support member;
    at least one downwardly extending leg on each side of said support member, said legs comprising sections severed from said clear margin and bent down out of the plane of the support member, the legs having a length to provide a clearance between trays for the positioning of devices and components on said foam material, and positioned to rest on said clear margin of a next lower tray.

* * * * *